United States Patent
Do et al.

(10) Patent No.: US 8,525,325 B2
(45) Date of Patent: Sep. 3, 2013

(54) INTEGRATED CIRCUIT PACKAGING SYSTEM WITH LEADS AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: Stats ChipPAC Ltd., Singapore (SG)

( * ) Notice: Subject to any disclaimer, the term of this patent is extended or adjusted under 35 U.S.C. 154(b) by 15 days.

(21) Appl. No.: 13/326,090

(22) Filed: Dec. 14, 2011

(65) Prior Publication Data

US 2013/0154080 A1    Jun. 20, 2013

(51) Int. Cl.
*H01L 23/10* (2006.01)
(52) U.S. Cl.
USPC .......................... 257/706; 257/676; 438/123
(58) Field of Classification Search
USPC ................ 257/330, 707, 676, 678, 687, 690, 257/692, 781, 782, 784, 786, 787, 124; 438/106, 123, 124
See application file for complete search history.

(56) References Cited

U.S. PATENT DOCUMENTS

| 7,622,801 | B2 | 11/2009 | Kurita |
| 7,777,351 | B1 | 8/2010 | Berry et al. |
| 7,986,048 | B2 | 7/2011 | Park et al. |
| 2007/0181983 | A1* | 8/2007 | Takai et al. ................ 257/666 |

OTHER PUBLICATIONS

U.S. Appl. No. 13/102,041, filed May 5, 2011, Do et al.
U.S. Appl. No. 13/325,881, filed Dec. 14, 2011, Do et al.

* cited by examiner

*Primary Examiner* — N Drew Richards
*Assistant Examiner* — Christina Sylvia
(74) *Attorney, Agent, or Firm* — Ishimaru & Associates LLP; I-Chang John Yang

(57) ABSTRACT

A method of manufacture of an integrated circuit packaging system includes: forming a lead; forming an interior conductive layer having an interior top side and an interior bottom side, the interior bottom side directly on the lead; mounting an integrated circuit over the lead, the integrated circuit having an inactive side and an active side; forming an encapsulation directly on the inactive side and the interior top side; and forming an insulation layer directly on the active side and a portion of the interior bottom side.

20 Claims, 8 Drawing Sheets

INTEGRATED CIRCUIT PACKAGING SYSTEM WITH LEADS AND METHOD OF MANUFACTURE THEREOF

TECHNICAL FIELD

The present invention relates generally to an integrated circuit packaging system, and more particularly to a system for an integrated circuit packaging system with leads.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a lead; forming an interior conductive layer having an interior top side and an interior bottom side, the interior bottom side directly on the lead; mounting an integrated circuit over the lead, the integrated circuit having an inactive side and an active side; forming an encapsulation directly on the inactive side and the interior top side; and forming an insulation layer directly on the active side and a portion of the interior bottom side.

The present invention provides an integrated circuit packaging system, including: a lead; an interior conductive layer having an interior top side and an interior bottom side, the interior bottom side directly on the lead; an integrated circuit over the lead, the integrated circuit having an inactive side and an active side; an encapsulation directly on the inactive side and the interior top side; and an insulation layer directly on the active side and a portion of the interior bottom side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
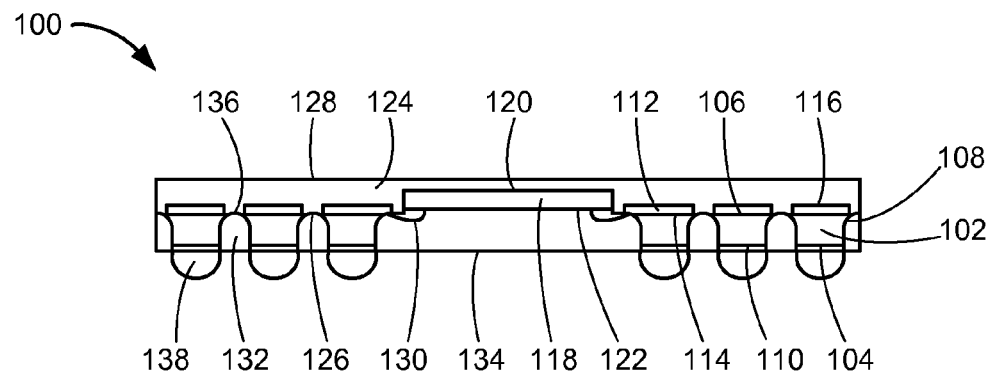
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
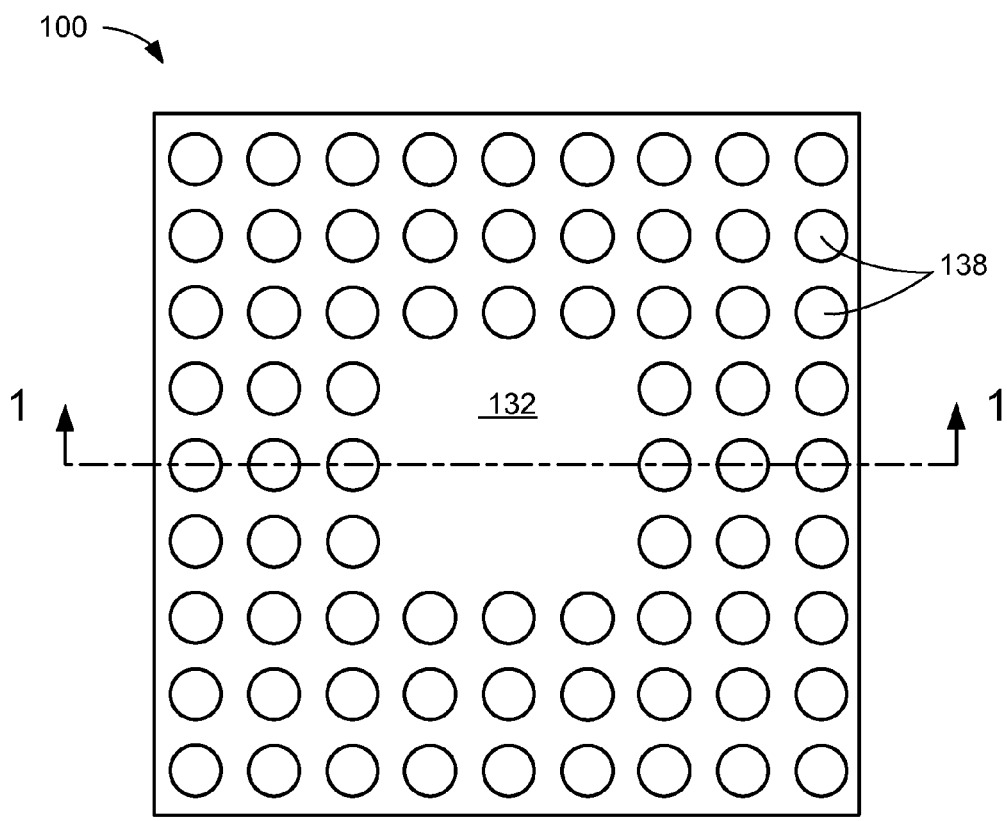
FIG. 2 is a bottom view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include leads 102, which are defined as structures that provide connectivity for electrical signals or electrical potential levels between a semiconductor device and an external system (not shown).

Each of the leads 102 can include a lead bottom side 104 and a lead top side 106 opposite the lead bottom side 104. The leads 102 are structurally isolated from each other. Each of the leads 102 can include a lead non-horizontal side 108, which is defined as a lateral side that defines a horizontal boundary of each of the leads 102. The lead non-horizontal side 108 extends from the lead bottom side 104 to the lead top side 106. The lead non-horizontal side 108 can include a curve surface including concave.

The integrated circuit packaging system 100 can include an exterior conductive layer 110, which is defined as an attachment site providing electrical connection between each of the leads 102 and the external system. The exterior conductive layer 110 can be formed directly on the lead bottom side 104.

The integrated circuit packaging system 100 can include an interior conductive layer 112, which is defined as a connection structure that provides electrical connectivity between a semiconductor device and the leads 102. The interior conductive layer 112 routes electrical connection or redistributes electrical signals between the semiconductor device and the leads 102.

The interior conductive layer 112 can include an interior bottom side 114 and an interior top side 116 opposite the interior bottom side 114. A portion of the interior bottom side 114 can be formed directly on the lead top side 106.

For example, the interior conductive layer 112 can include a conductive trace. Also for example, the interior conductive layer 112 can represent a connection structure including an embedded routable conductive trace, an additive routable conductive trace, or a redistribution layer.

The integrated circuit packaging system 100 can include an integrated circuit 118, which is defined as a semiconductor device. The integrated circuit 118 can include an inactive side 120 and an active side 122 opposite the inactive side 120. The active side 122 can be above the interior bottom side 114. For example, the integrated circuit 118 can represent a semiconductor device including an integrated circuit die.

The integrated circuit 118 can be mounted over the leads 102 with the active side 122 facing the leads 102 and the interior conductive layer 112. At least two non-horizontal sides of the integrated circuit 118 can be horizontally surrounded by the leads 102. The leads 102 can be outside a horizontal perimeter of the integrated circuit 118.

The integrated circuit packaging system 100 can include an encapsulation 124, which is defined as a package cover of a semiconductor package to seal a semiconductor device providing mechanical and environmental protection. The encapsulation 124 can include an encapsulation bottom side 126 and an encapsulation top side 128 opposite the encapsulation bottom side 126.

The encapsulation 124 can be formed covering or directly on a portion of the lead top side 106, the interior top side 116, and the inactive side 120. The encapsulation bottom side 126 can be coplanar with the interior bottom side 114. The encapsulation bottom side 126 can be below the active side 122.

The integrated circuit packaging system 100 can include internal connectors 130, which are defined as electrically conductive connectors. The internal connectors 130 can be connected or attached to the interior bottom side 114 and the active side 122. For example, the internal connectors 130 can represent electrically conductive connectors including bond wires.

The integrated circuit packaging system 100 can include an insulation layer 132, which is defined as a structure that protects a portion of the interior bottom side 114 and the active side 122. The insulation layer 132 can include an insulation bottom side 134 and an insulation top side 136 opposite the insulation bottom side 134. The internal connectors 130 can be horizontally surrounded by an array of the leads 102 adjacent at least two peripheral sides of the insulation layer 132.

The insulation layer 132 can be formed covering or directly on the lead non-horizontal side 108, a non-horizontal side of the exterior conductive layer 110, a portion of the interior bottom side 114, the active side 122, the internal connectors 130, and a portion of the encapsulation bottom side 126. The insulation layer 132 can be formed between the leads 102.

For illustration purposes, a bottom extent of the exterior conductive layer 110 and the insulation bottom side 134 are shown coplanar with each other, although it is understood that the bottom extent can be below or above the insulation bottom side 134. For example, the insulation bottom side 134 can be above a bottom extent of the exterior conductive layer 110. Also for example, the lead bottom side 104 and the insulation bottom side 134 can be coplanar with each other.

The integrated circuit packaging system 100 can optionally include external connectors 138, which are defined as electrically conductive connectors. The external connectors 138 can be attached to the exterior conductive layer 110 and the external system. The external connectors 138 can represent electrical connectors including conductive balls.

It has been discovered that the internal connectors 130 connected to the active side 122 and the interior bottom side 114 and the internal connectors 130 horizontally surrounded by an array of the leads 102 attached to at least two non-horizontal sides of the integrated circuit 118 provides improved vertical height profile reduction for a semiconductor package since spacing between the leads 102 is used for connecting the internal connectors 130.

It has also been discovered that the encapsulation 124 directly on the inactive side 120 and the interior top side 116 provides improved reliability since the encapsulation 124 provides mechanical and environmental protection to the integrated circuit 118 and the interior conductive layer 112.

It has further been discovered that the insulation layer 132 directly on the active side 122 and a portion of the interior bottom side 114 provides improved reliability since the insulation layer 132 provides mechanical and environmental protection to the integrated circuit 118 and the interior conductive layer 112.

It has yet further been discovered that the encapsulation bottom side 126 coplanar with the interior bottom side 114 provides improved reliability since the encapsulation 124 provides mechanical and environmental protection to the integrated circuit 118 and the interior conductive layer 112.

It has yet further been discovered that the active side 122 facing the lead top side 106 and the interior top side 116 provides improved vertical height profile reduction with the internal connectors 130 attached to the active side 122 and the interior bottom side 114 in the spacing completely horizontally surrounded by the leads 102 resulting in an extremely thin leadframe grid array (LFGA) package.

Referring now to FIG. 2, therein is shown a bottom view of the integrated circuit packaging system 100. The bottom view depicts an array of the external connectors 138 adjacent a periphery of the insulation layer 132.

Figure 3:
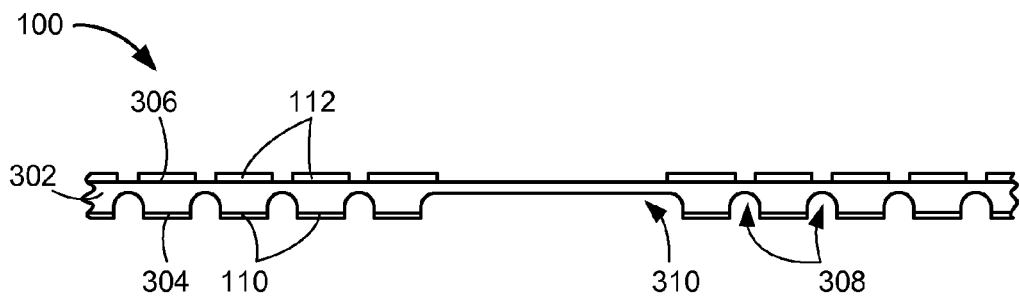
FIG. 3 is a cross-sectional view of the integrated circuit packaging system in a plating phase of manufacture.

Referring now to FIG. 3, therein is shown a cross-sectional view of the integrated circuit packaging system 100 in a plating phase of manufacture. The integrated circuit packaging system 100 can include a carrier 302, which is defined as a support structure formed with a conductive material. The carrier 302 can include a conductive material including copper (Cu), any other metals, or metallic alloys. The carrier 302 can represent a support structure including a leadframe or a substrate.

The carrier 302 can include a carrier bottom side 304 and a carrier top side 306 opposite the carrier bottom side 304. A portion of the carrier top side 306 can be plated with the interior conductive layer 112 directly thereon. For example, the interior conductive layer 112 can include an additive routable conductive trace.

The carrier 302 can include a carrier recess portion 308 having a bottom extent above the carrier bottom side 304. The carrier 302 can include a carrier attachment portion 310 at a central region of the carrier 302. The carrier attachment portion 310 can include a bottom extent above the carrier bottom side 304. For example, the carrier attachment portion 310 can provide a function similar to that of a die attach paddle for mounting or attaching a semiconductor device.

The exterior conductive layer 110 can be formed directly on the carrier bottom side 304. The exterior conductive layer 110 can be formed with a conductor forming process including plating or pre-plated leadframe (PPF). The interior conductive layer 112 can be formed directly on the carrier top side 306. The interior conductive layer 112 can be formed with a conductor forming process including plating or pre-plated leadframe (PPF).

Areas of the carrier 302 at the carrier bottom side 304 surrounding a non-horizontal side of the exterior conductive layer 110 can be partially removed to form the carrier recess portion 308 and the carrier attachment portion 310. For example, the carrier 302 can be partially removed with a removal process including pre-plated leadframe (PPF) selective etching. Also for example, the carrier 302 can optionally be partially removed including pre-etched prior to the plating phase.

For illustration purposes, the carrier 302 is shown pre-etched at the carrier bottom side 304, although it is understood that the carrier 302 can optionally be non-etched in the plating phase and partially removed in a subsequent phase. For example, the carrier 302 can be partially removed at the carrier bottom side 304 with the removal process after molding in a subsequent phase.

For some embodiments of the present invention, the integrated circuit packaging system 100 can optionally include a conductive pillar or a conductive metal build up at a top extent of the interior conductive layer 112. The conductive pillar or the conductive metal build up can be formed for package stacking.

The carrier 302 can optionally include a cavity at the carrier top side 306 at the carrier attachment portion 310 to lower or reduce a vertical height profile of the conductive pillar or the conductive metal build up. In this case, a portion of the carrier bottom side 304 at the carrier attachment portion 310 can be coplanar with another portion of the carrier bottom side 304 where the exterior conductive layer 110 is attached. In addition, a top extent of the carrier attachment portion 310 can be below the carrier top side 306.

For some embodiments of the present invention, the integrated circuit packaging system 100 can include an application of a layer of dielectric directly on the interior conductive layer 112 to form a second conductive layer over the interior conductive layer. Holes or vias in the layer of dielectric can be formed by selectively removing a portion of the layer of dielectric. The vias can be filled with an electrically conductive material.

The second conductive layer can be formed directly on the electrically conductive material within the holes in order to be electrically connected to the interior conductive layer 112. For example, the second conductive layer can include an additive routable conductive trace.

Figure 4:
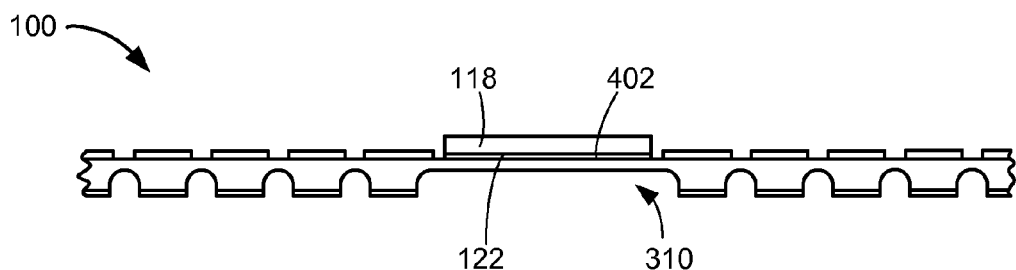
FIG. 4 is the structure of FIG. 3 in an attachment phase.

Referring now to FIG. 4, therein is shown the structure of FIG. 3 in an attachment phase. The integrated circuit 118 can be mounted over the carrier attachment portion 310. The active side 122 can be attached to a top extent of the carrier attachment portion 310 with an attach layer 402, which is defined as a structure for mounting a semiconductor device to a support structure. The attach layer 402 protects the integrated circuit 118 from the removal process of FIG. 3 including etching. For example, the attach layer 402 can represent film layer, a protective layer, a protective thermal film layer, or a dissolvable film.

The integrated circuit 118 can be attached, with the active side 122 including a bondable active area facing vertically downward, by the attach layer 402. The attach layer 402 can represent as a structure with a protective material for protecting the integrated circuit 118 from the removal process including copper (Cu) etching. The attach layer 402 can also represent a thermal layer. The attach layer 402 can be removable after the removal process including chemical etching.

Figure 5:
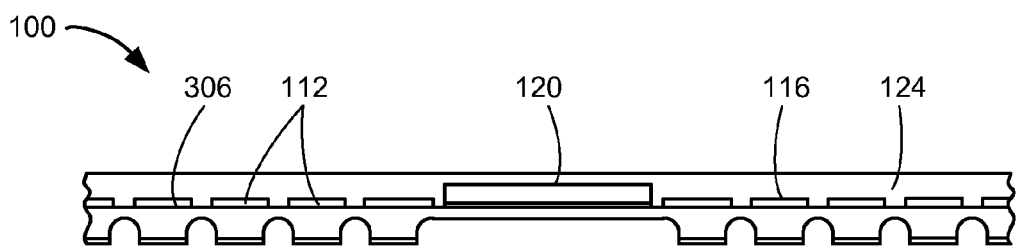
FIG. 5 is the structure of FIG. 4 in a molding phase.

Referring now to FIG. 5, therein is shown the structure of FIG. 4 in a molding phase. The molding phase can include a primary encapsulation process to cover the interior conductive layer 112 and the inactive side 120. For example, the interior conductive layer 112 can represent a routing layer. Also for example, the inactive side 120 can represent a die backside.

The integrated circuit packaging system 100 can include a molding process to form the encapsulation 124. The encapsulation 124 can be formed covering a portion of the carrier top side 306, the interior top side 116, and the inactive side 120.

Figure 6:
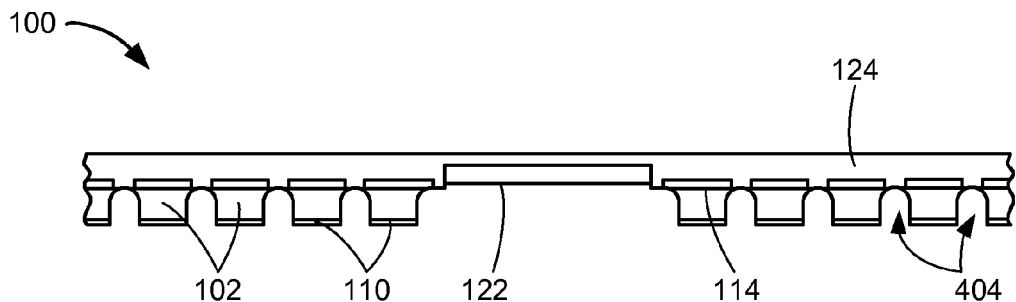
FIG. 6 is the structure of FIG. 5 in a removal phase.

Referring now to FIG. 6, therein is shown the structure of FIG. 5 in a removal phase. The integrated circuit packaging system 100 can include a removal process including bottom etching to remove the carrier recess portion 308 of FIG. 3 and the carrier attachment portion 310 of FIG. 3 to form the leads 102 and a carrier opening 404.

The exterior conductive layer 110 can be preserved after the removal process including etching. The carrier bottom side 304 of FIG. 3 can be partially removed up to the attach layer 402 of FIG. 4. For example, the exterior conductive layer 110 can represent a terminal.

The attach layer 402 can be peeled off or removed in the removal phase to expose the active side 122. Portions of bottom extents of the interior bottom side 114, the active side 122, and the encapsulation 124 can be exposed by the carrier opening 404.

Figure 7:
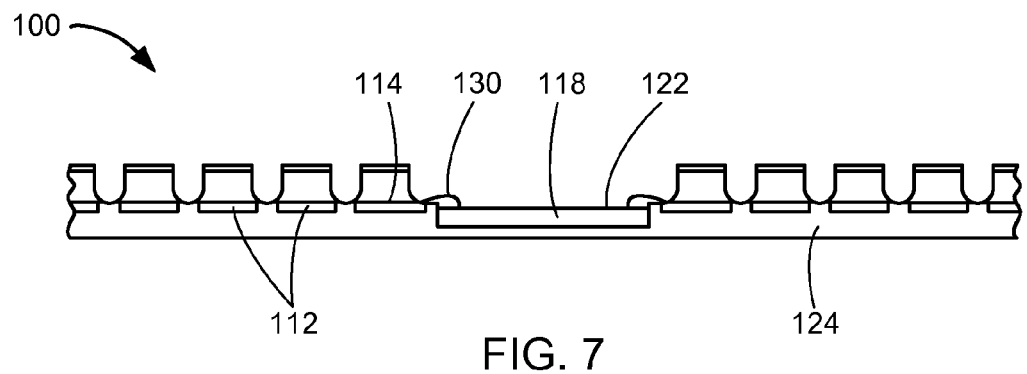
FIG. 7 is the structure of FIG. 6 in an internal connection phase.

Referring now to FIG. 7, therein is shown the structure of FIG. 6 in an internal connection phase. FIG. 7 is shown with the structure of FIG. 6 vertically inverted. With the active side 122 exposed from the encapsulation 124, the internal connectors 130 can be attached to the interior bottom side 114 and the active side 122.

The integrated circuit packaging system 100 can enable an extremely thin LFGA package concept to come into fruition. The internal connectors 130 including wire connections between the integrated circuit 118 and the interior conductive layer 112 can leverage available bottom half-etch spacing of the integrated circuit packaging system 100.

Figure 8:
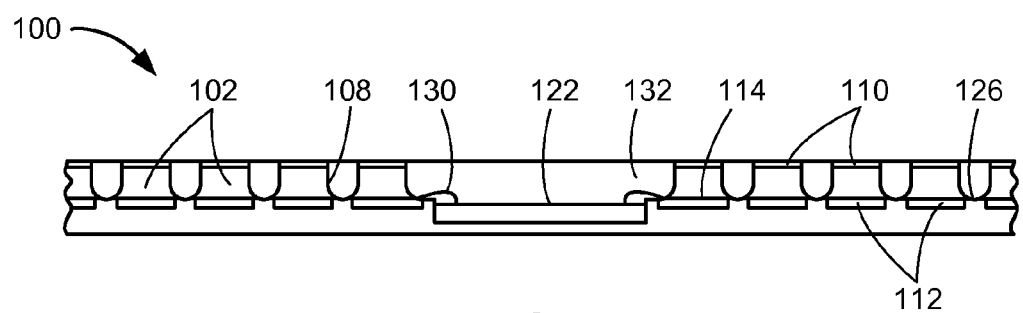
FIG. 8 is the structure of FIG. 7 in an insulation-formation phase.

Referring now to FIG. 8, therein is shown the structure of FIG. 7 in an insulation-formation phase. The insulation-formation phase can be performed to cover the rest of exposed circuitry of the interior conductive layer 112.

The insulation layer 132 can be formed covering the lead non-horizontal side 108, a non-horizontal side of the exterior conductive layer 110, a portion of the interior bottom side 114, the active side 122, the internal connectors 130, and a portion of the encapsulation bottom side 126. The insulation layer 132 can be formed between the leads 102.

Figure 9:
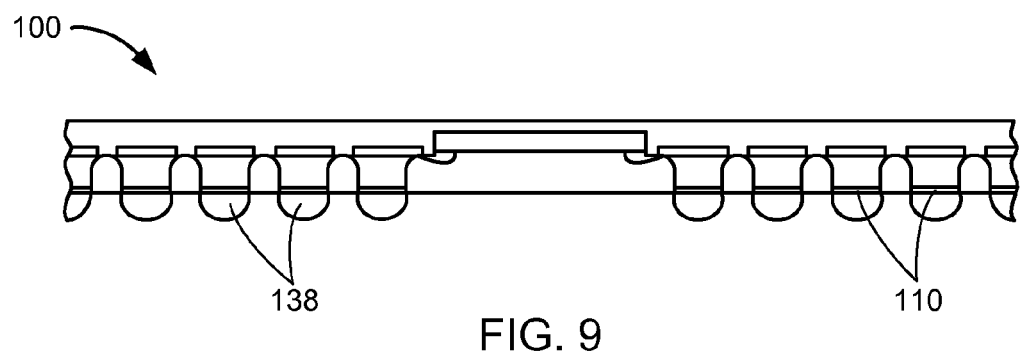
FIG. 9 is the structure of FIG. 8 in an external connection phase.

Referring now to FIG. 9, therein is shown the structure of FIG. 8 in an external connection phase. FIG. 9 is shown with the structure of FIG. 8 vertically inverted. The external connectors 138 can optionally be attached to the exterior conductive layer 110 and the external system. The external connectors 138 can be formed with a conductive material including solder, a metallic material, or a metallic alloy.

In a subsequent phase, the integrated circuit packaging system 100 can include a package singulation process to produce individual units or packages of the integrated circuit packaging system 100. The package singulation process can include a mechanical or optical process.

Figure 10:
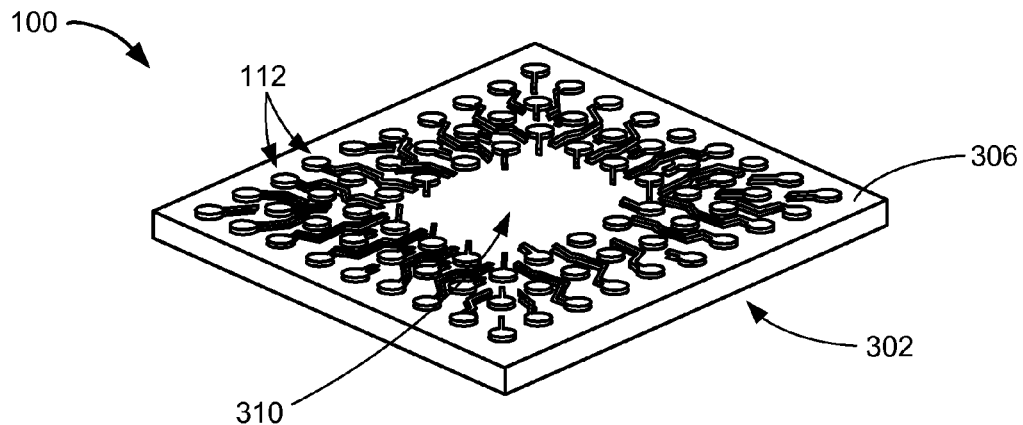
FIG. 10 is a top isometric view of the integrated circuit packaging system in a plating phase of manufacture.

Referring now to FIG. 10, therein is shown a top isometric view of the integrated circuit packaging system 100 in a plating phase of manufacture. The integrated circuit packaging system 100 can include the carrier 302. The interior conductive layer 112 can be formed directly on a portion of the carrier top side 306. For example, the top isometric view depicts the carrier 302 as a support structure including a copper sheet without routing at the carrier attachment portion 310.

Figure 11:
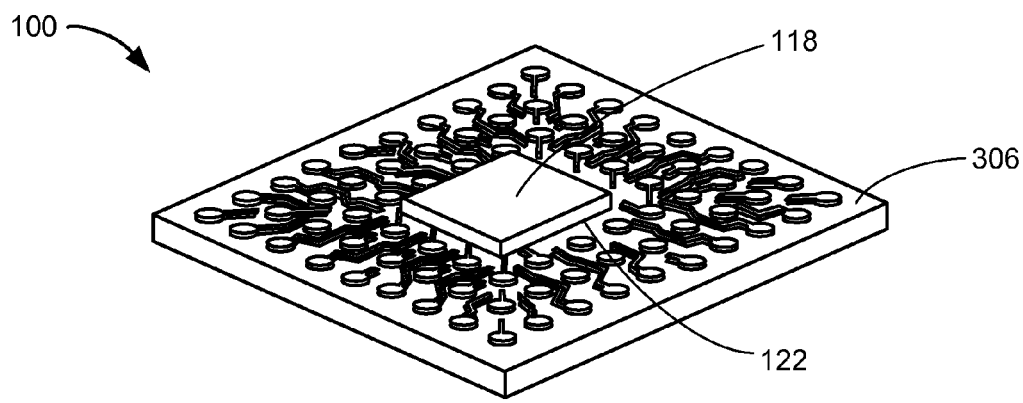
FIG. 11 is the structure of FIG. 10 in an attachment phase.

Referring now to FIG. 11, therein is shown the structure of FIG. 10 in an attachment phase. The integrated circuit 118 can be mounted over the carrier top side 306. The active side 122 can be attached to the carrier top side 306 with the attach layer 402 of FIG. 4.

Figure 12:
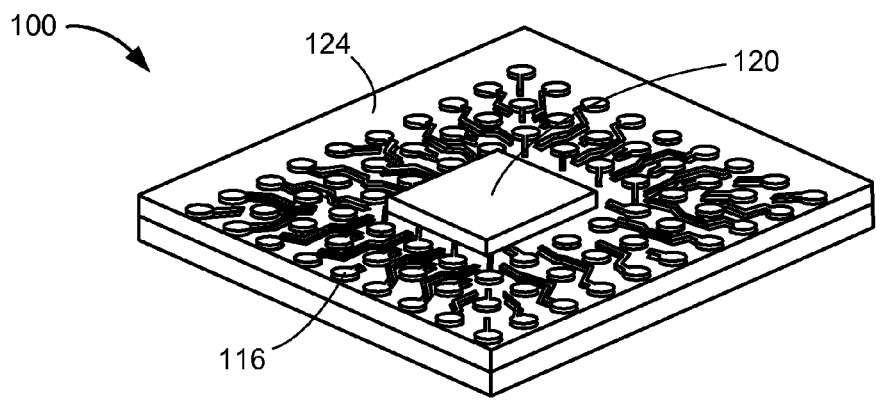
FIG. 12 is the structure of FIG. 11 in a molding phase.

Referring now to FIG. 12, therein is shown the structure of FIG. 11 in a molding phase. The encapsulation 124 can be formed covering the interior top side 116 and the inactive side 120.

Figure 13:
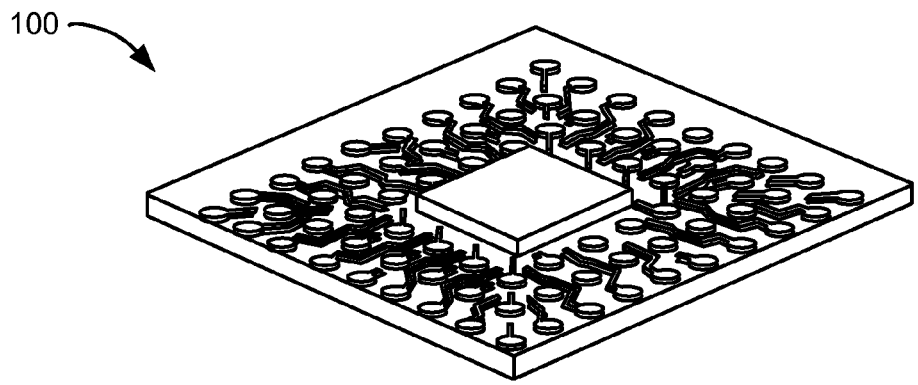
FIG. 13 is the structure of FIG. 12 in a removal phase.

Referring now to FIG. 13, therein is shown the structure of FIG. 12 in a removal phase. The carrier 302 of FIG. 10 can be partially removed or dissolved. The attach layer 402 of FIG. 4 can also be removed in the removal phase leaving a clean die surface.

Figure 14:
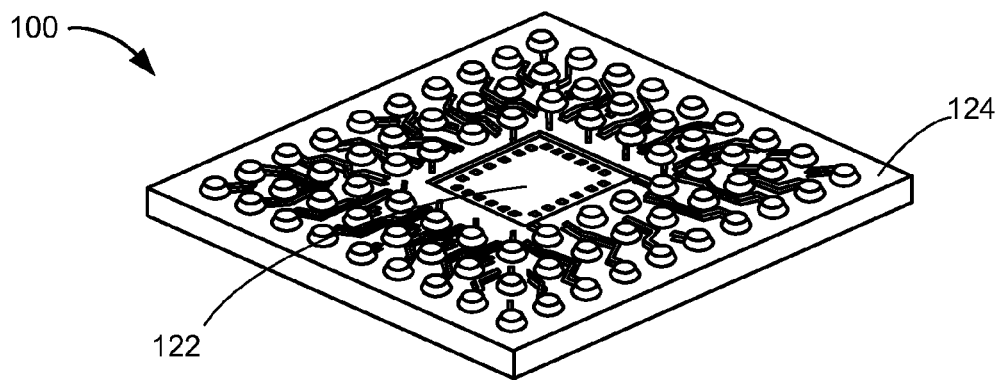
FIG. 14 is a bottom isometric view of the structure of FIG. 13.

Referring now to FIG. 14, therein is shown a bottom isometric view of the structure of FIG. 13. The bottom isometric view depicts the carrier attachment portion 310 of FIG. 3 removed exposing the active side 122 from the encapsulation 124.

Figure 15:
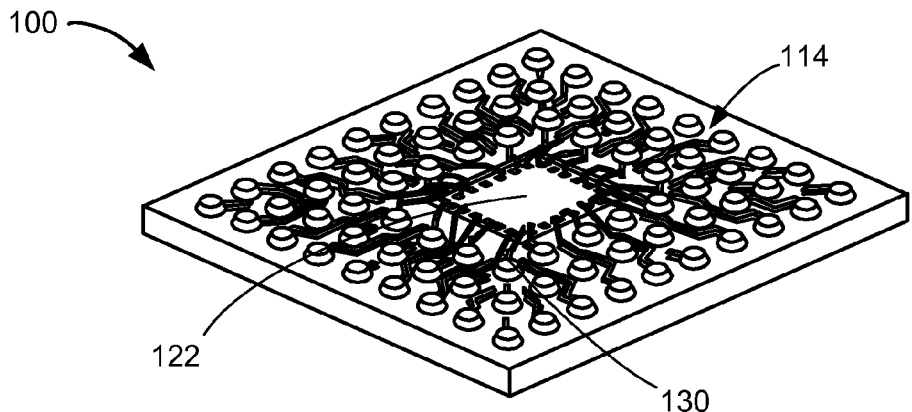
FIG. 15 is the structure of FIG. 14 in an internal connection phase.

Referring now to FIG. 15, therein is shown the structure of FIG. 14 in an internal connection phase. The internal connectors 130 can be attached to the interior bottom side 114 and the active side 122.

Figure 16:
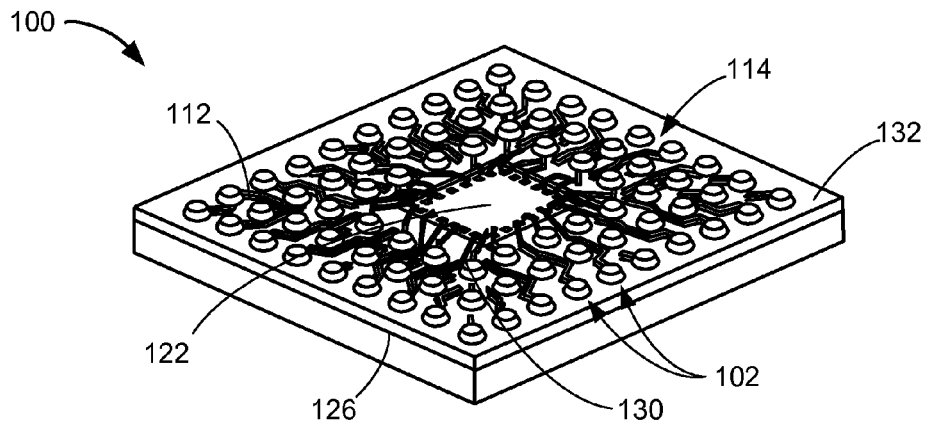
FIG. 16 is the structure of FIG. 15 in an insulation-formation phase.

Referring now to FIG. 16, therein is shown the structure of FIG. 15 in an insulation-formation phase. The insulation layer 132 can be formed to provide protection to the interior conductive layer 112. The insulation layer 132 can be formed covering a portion of the interior bottom side 114, the active side 122, the internal connectors 130, and a portion of the encapsulation bottom side 126. The insulation layer 132 can be formed between the leads 102. The structure of FIG. 16 can represent a land grid array (LGA) package.

Figure 17:
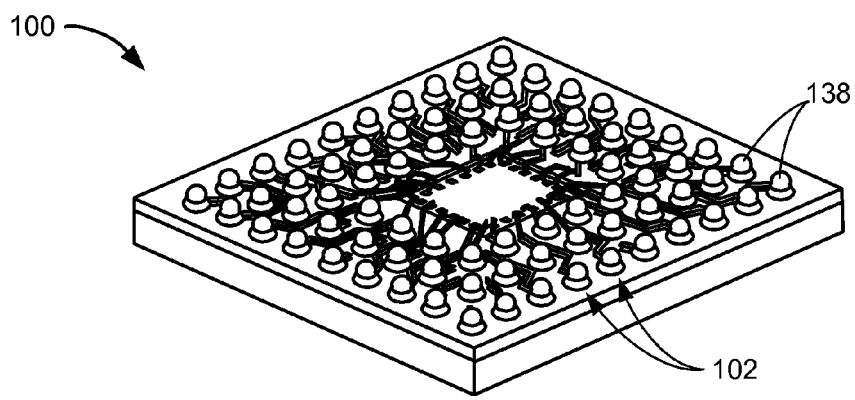
FIG. 17 is the structure of FIG. 16 in an external connection phase.

Referring now to FIG. 17, therein is shown the structure of FIG. 16 in an external connection phase. The integrated circuit packaging system 100 can optionally include the external connectors 138. The external connectors 138 can be attached to the leads 102 and the external system.

In a subsequent phase, the integrated circuit packaging system 100 can include a package singulation process to produce individual units or packages of the integrated circuit packaging system 100. The package singulation process can include a mechanical or optical process.

Figure 18:
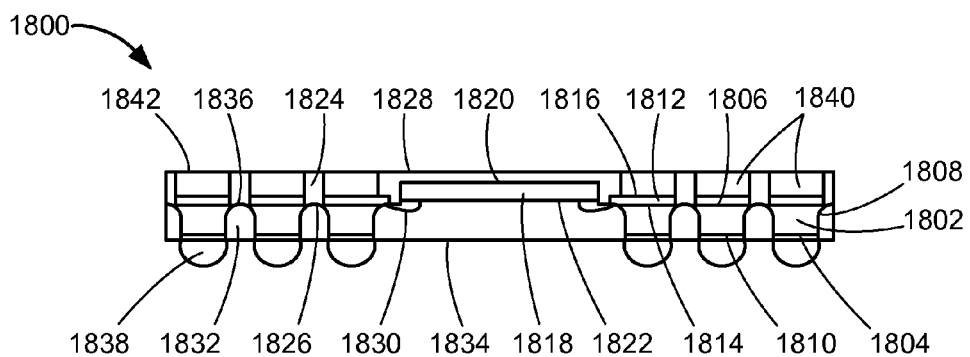
FIG. 18 is a cross-sectional view of an integrated circuit packaging system in a second embodiment of the present invention.

Referring now to FIG. 18, therein is shown a cross-sectional view of an integrated circuit packaging system 1800 in a second embodiment of the present invention. In a manner similar to the integrated circuit packaging system 100 of FIG. 1, the integrated circuit packaging system 1800 includes leads 1802, each having a lead bottom side 1804, a lead top side 1806, and a lead non-horizontal side 1808. In a manner similar to the integrated circuit packaging system 100, the integrated circuit packaging system 1800 includes an exterior conductive layer 1810 and an interior conductive layer 1812 having an interior bottom side 1814 and an interior top side 1816. In a manner similar to the integrated circuit packaging system 100, the integrated circuit packaging system 1800 includes an integrated circuit 1818 having an inactive side 1820 and an active side 1822.

In a manner similar to the integrated circuit packaging system 100, the integrated circuit packaging system 1800 includes an encapsulation 1824 having an encapsulation bottom side 1826 and an encapsulation top side 1828. In a manner similar to the integrated circuit packaging system 100, the integrated circuit packaging system 1800 includes internal connectors 1830 and an insulation layer 1832 having an insulation bottom side 1834 and an insulation top side 1836. In a manner similar to the integrated circuit packaging system 100, the integrated circuit packaging system 1800 includes external connectors 1838.

The integrated circuit packaging system 1800 can include vertical connectors 1840 with each of the vertical connectors 1840 having a connector top side 1842. The vertical connectors 1840 are defined as electrically conductive connectors. The vertical connectors 1840 can be formed directly on the interior top side 1816. For example, the vertical connectors 1840 can represent electrically conductive connectors including a conductive pillar or a conductive metal build up.

The encapsulation 1824 can be formed directly on the vertical connectors 1840. The connector top side 1842 can be exposed from the encapsulation 1824. The connector top side 1842 can be coplanar with the encapsulation top side 1828.

It has been discovered that the internal connectors 1830 connected to the active side 1822 and the interior bottom side 1814 and the internal connectors 1830 horizontally surrounded by an array of the leads 1802 attached to at least two non-horizontal sides of the integrated circuit 1818 provides improved vertical height profile reduction for a semiconductor package since spacing between the leads 1802 is used for connecting the internal connectors 1830.

It has also been discovered that the encapsulation 1824 directly on the inactive side 1820 and the interior top side 1816 provides improved reliability since the encapsulation 1824 provides mechanical and environmental protection to the integrated circuit 1818 and the interior conductive layer 1812.

It has further been discovered that the insulation layer 1832 directly on the active side 1822 and a portion of the interior bottom side 1814 provides improved reliability since the insulation layer 1832 provides mechanical and environmental protection to the integrated circuit 1818 and the interior conductive layer 1812.

It has yet further been discovered that the encapsulation bottom side 1826 coplanar with the interior bottom side 1814 provides improved reliability since the encapsulation 1824 provides mechanical and environmental protection to the integrated circuit 1818 and the interior conductive layer 1812.

It has yet further been discovered that the active side 1822 facing the lead top side 1806 and the interior top side 1816 provides improved vertical height profile reduction with the internal connectors 1830 attached to the active side 1822 and the interior bottom side 1814 in the spacing completely horizontally surrounded by the leads 1802.

It has yet further been discovered that the vertical connectors 1840 each having the connector top side 1842 exposed from the encapsulation 1824 provides improved reliability since the vertical connectors 1840 includes a robust structure for stacking integrated circuit packing systems.

Figure 19:
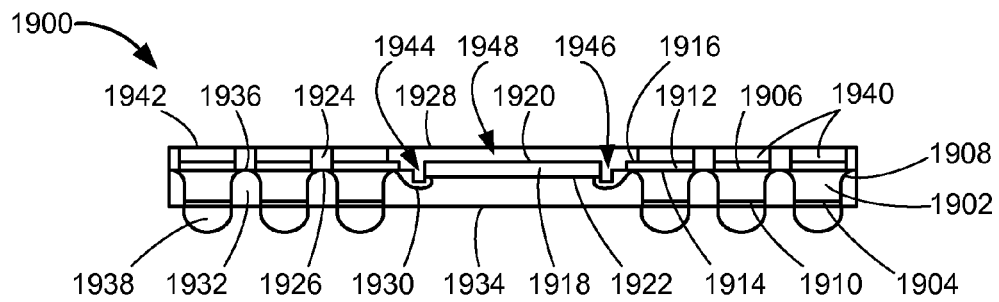
FIG. 19 is a cross-sectional view of an integrated circuit packaging system in a third embodiment of the present invention.

Referring now to FIG. 19, therein is shown a cross-sectional view of an integrated circuit packaging system 1900 in a third embodiment of the present invention. In a manner similar to the integrated circuit packaging system 100 of FIG. 1, the integrated circuit packaging system 1900 includes leads 1902, each having a lead bottom side 1904, a lead top side 1906, and a lead non-horizontal side 1908. In a manner similar to the integrated circuit packaging system 100, the integrated circuit packaging system 1900 includes an exterior conductive layer 1910 and an interior conductive layer 1912 having an interior bottom side 1914 and an interior top side 1916. In a manner similar to the integrated circuit packaging system 100, the integrated circuit packaging system 1900 includes an integrated circuit 1918 having an inactive side 1920 and an active side 1922.

In a manner similar to the integrated circuit packaging system 100, the integrated circuit packaging system 1900 includes an encapsulation 1924 having an encapsulation bottom side 1926 and an encapsulation top side 1928. In a manner similar to the integrated circuit packaging system 100, the integrated circuit packaging system 1900 includes internal connectors 1930 and an insulation layer 1932 having an insulation bottom side 1934 and an insulation top side 1936. In a manner similar to the integrated circuit packaging system 100, the integrated circuit packaging system 1900 includes external connectors 1938.

The integrated circuit packaging system 1900 can include vertical connectors 1940 with each of the vertical connectors 1940 having a connector top side 1942. The vertical connectors 1940 can be formed directly on the interior top side 1916. The encapsulation 1924 can be formed directly on the vertical connectors 1940. The connector top side 1942 can be exposed from the encapsulation 1924. The connector top side 1942 can be coplanar with the encapsulation top side 1928.

The insulation layer 1932 can include an insulation recess 1944, an insulation recess portion 1946, and an insulation step portion 1948. The insulation recess 1944 is defined as an indentation at the insulation top side 1936. The insulation recess 1944 is vertically bounded by a top extent of the insulation recess portion 1946 and a top extent of the insulation step portion 1948.

The insulation recess portion 1946 is defined as a portion of the insulation layer 1932 vertically extending below the insulation top side 1936. The insulation step portion 1948 is defined as a portion of the insulation layer 1932 vertically extending above a top extent of the insulation recess portion 1946.

The active side 1922 can be directly on a top extent of the insulation step portion 1948. A portion of a non-horizontal side of the integrated circuit 1918 can be within the insulation recess 1944. The portion of the non-horizontal side can be horizontally surrounded by a non-horizontal side of the insulation layer 1932 within the insulation recess 1944.

It has been discovered that the internal connectors 1930 connected to the active side 1922 and the interior bottom side 1914 and the internal connectors 1930 horizontally surrounded by an array of the leads 1902 attached to at least two non-horizontal sides of the integrated circuit 1918 provides improved vertical height profile reduction for a semiconductor package since spacing between the leads 1902 is used for connecting the internal connectors 1930.

It has also been discovered that the encapsulation 1924 directly on the inactive side 1920 and the interior top side 1916 provides improved reliability since the encapsulation 1924 provides mechanical and environmental protection to the integrated circuit 1918 and the interior conductive layer 1912.

It has further been discovered that the insulation layer 1932 directly on the active side 1922 and a portion of the interior bottom side 1914 provides improved reliability since the insulation layer 1932 provides mechanical and environmental protection to the integrated circuit 1918 and the interior conductive layer 1912.

It has yet further been discovered that the encapsulation bottom side 1926 coplanar with the interior bottom side 1914 provides improved reliability since the encapsulation 1924 provides mechanical and environmental protection to the integrated circuit 1918 and the interior conductive layer 1912.

It has yet further been discovered that the active side 1922 facing the lead top side 1906 and the interior top side 1916 provides improved vertical height profile reduction with the internal connectors 1930 attached to the active side 1922 and the interior bottom side 1914 in the spacing completely horizontally surrounded by the leads 1902.

It has yet further been discovered that the vertical connectors 1940 each having the connector top side 1942 exposed from the encapsulation 1924 provides improved reliability since the vertical connectors 1940 includes a robust structure for stacking integrated circuit packing systems.

It has yet further been discovered that the insulation layer 1932 having the insulation recess portion 1946 and the insulation step portion 1948 with the active side 1922 directly thereon provides improved vertical height profile reduction with the integrated circuit 1918 vertically mounted within the spacing completely horizontally surrounded by an array of the leads 1902.

Figure 20:
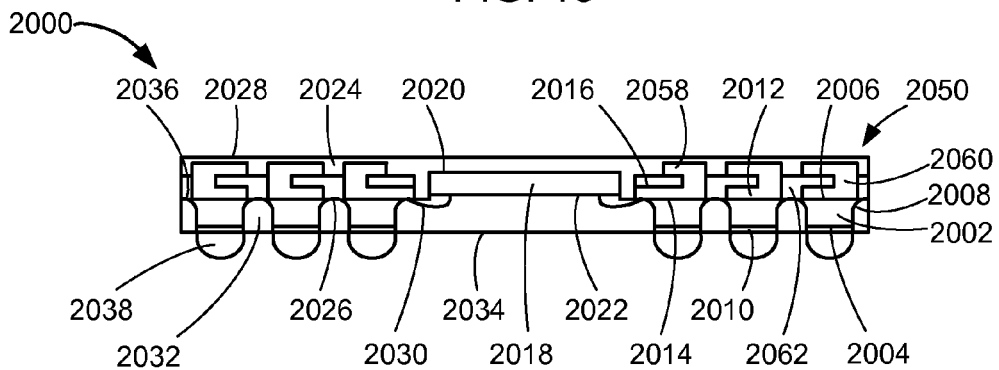
FIG. 20 is a cross-sectional view of an integrated circuit packaging system in a fourth embodiment of the present invention.

Referring now to FIG. 20, therein is shown a cross-sectional view of an integrated circuit packaging system 2000 in a fourth embodiment of the present invention. In a manner similar to the integrated circuit packaging system 100 of FIG. 1, the integrated circuit packaging system 2000 includes leads 2002, each having a lead bottom side 2004, a lead top side 2006, and a lead non-horizontal side 2008. In a manner similar to the integrated circuit packaging system 100, the integrated circuit packaging system 2000 includes an exterior conductive layer 2010 and an interior conductive layer 2012 having an interior bottom side 2014 and an interior top side 2016. In a manner similar to the integrated circuit packaging system 100, the integrated circuit packaging system 2000 includes an integrated circuit 2018 having an inactive side 2020 and an active side 2022.

In a manner similar to the integrated circuit packaging system 100, the integrated circuit packaging system 2000 includes an encapsulation 2024 having an encapsulation bottom side 2026 and an encapsulation top side 2028. In a manner similar to the integrated circuit packaging system 100, the integrated circuit packaging system 2000 includes internal connectors 2030 and an insulation layer 2032 having an insulation bottom side 2034 and an insulation top side 2036. In a manner similar to the integrated circuit packaging system 100, the integrated circuit packaging system 2000 includes external connectors 2038.

The integrated circuit packaging system 2000 includes a multi-layer conductive structure 2050, which is defined as a connection structure with a number of conductive layers providing electrical connectivity between a semiconductor device and the leads 2002. The multi-layer conductive structure 2050 includes the interior conductive layer 2012.

The multi-layer conductive structure 2050 also includes an additional interior conductive layer 2058, an interior connection layer 2060, and an interior insulation layer 2062. For illustration purposes, the multi-layer conductive structure 2050 is shown with two conductive layers including the interior conductive layer 2012 and the additional interior conductive layer 2058, although it is understood that the multi-layer conductive structure 2050 can include any number of conductive layers.

The additional interior conductive layer 2058 is defined as a connection structure that provides electrical connectivity between a semiconductor device and the leads 2002. The additional interior conductive layer 2058 can be formed to connect the leads 2002 to a semiconductor device including another integrated circuit or a semiconductor package stacked over the integrated circuit 2018.

The interior connection layer 2060 is formed to structurally and electrically connect or attach to the interior conductive layer 2012 and the additional interior conductive layer 2058. The interior insulation layer 2062 is defined as a structure covering the interior conductive layer 2012 to provide electrical isolation between the interior conductive layer 2012 and the additional interior conductive layer 2058.

The interior insulation layer 2062 can be formed with holes or vias filled with an electrically conductive material to form the interior connection layer 2060. The additional interior conductive layer 2058 can be formed directly on the interior connection layer 2060 and the interior insulation layer 2062. The interior connection layer 2060 can be formed through the interior insulation layer 2062 and directly on the interior conductive layer 2012. The interior insulation layer 2062 can be formed with an insulation material including dielectric.

The additional interior conductive layer 2058 can be formed directly over the interior conductive layer 2012. The encapsulation 2024 can be formed over and directly on the additional interior conductive layer 2058 and the interior insulation layer 2062. The direction of the interior conductive layer 2012 and the additional interior conductive layer 2058 is shown inward to indicate that the routing layers are towards the integrated circuit 2018.

It has been discovered that the internal connectors 2030 connected to the active side 2022 and the interior bottom side 2014 and the internal connectors 2030 horizontally surrounded by an array of the leads 2002 attached to at least two non-horizontal sides of the integrated circuit 2018 provides improved vertical height profile reduction for a semiconductor package since spacing between the leads 2002 is used for connecting the internal connectors 2030.

It has also been discovered that the encapsulation 2024 directly on the inactive side 2020 and the interior top side 2016 provides improved reliability since the encapsulation 2024 provides mechanical and environmental protection to the integrated circuit 2018 and the interior conductive layer 2012.

It has further been discovered that the insulation layer 2032 directly on the active side 2022 and a portion of the interior bottom side 2014 provides improved reliability since the insulation layer 2032 provides mechanical and environmental protection to the integrated circuit 2018 and the interior conductive layer 2012.

It has yet further been discovered that the encapsulation bottom side 2026 coplanar with the interior bottom side 2014 provides improved reliability since the encapsulation 2024 provides mechanical and environmental protection to the integrated circuit 2018 and the interior conductive layer 2012.

It has yet further been discovered that the active side 2022 facing the lead top side 2006 and the interior top side 2016 provides improved vertical height profile reduction with the internal connectors 2030 attached to the active side 2022 and the interior bottom side 2014 in the spacing completely horizontally surrounded by the leads 2002.

It has yet further been discovered that the multi-layer conductive structure 2050 provides improved system performance with the multi-layer conductive structure 2050 having the interior conductive layer 2012, the additional interior conductive layer 2058, the interior connection layer 2060, and the interior insulation layer 2062 providing additional routable conducive traces thereby eliminating shorts and congestions problems that are inevitably in single-layer distribution structures.

Figure 21:
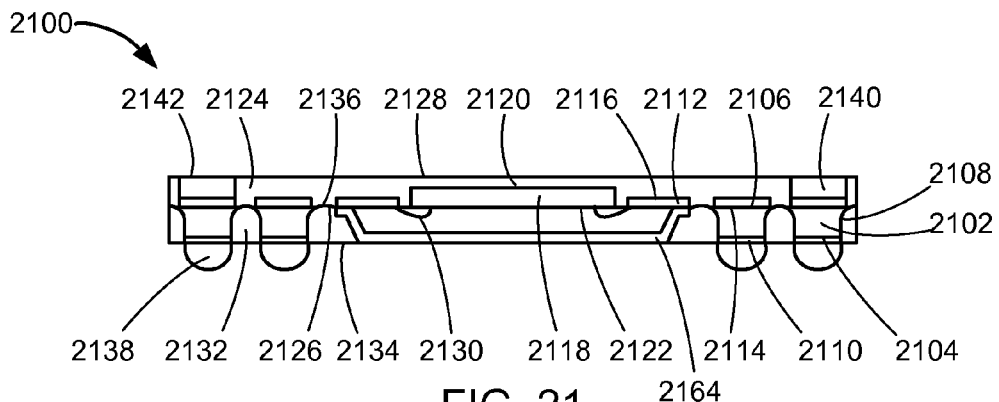
FIG. 21 is a cross-sectional view of an integrated circuit packaging system in a fifth embodiment of the present invention.

Referring now to FIG. 21, therein is shown a cross-sectional view of an integrated circuit packaging system 2100 in a fifth embodiment of the present invention. In a manner similar to the integrated circuit packaging system 100 of FIG. 1, the integrated circuit packaging system 2100 includes leads 2102, each having a lead bottom side 2104, a lead top side 2106, and a lead non-horizontal side 2108. In a manner similar to the integrated circuit packaging system 100, the integrated circuit packaging system 2100 includes an exterior conductive layer 2110 and an interior conductive layer 2112 having an interior bottom side 2114 and an interior top side 2116. In a manner similar to the integrated circuit packaging system 100, the integrated circuit packaging system 2100 includes an integrated circuit 2118 having an inactive side 2120 and an active side 2122.

In a manner similar to the integrated circuit packaging system 100, the integrated circuit packaging system 2100 includes an encapsulation 2124 having an encapsulation bottom side 2126 and an encapsulation top side 2128. In a manner similar to the integrated circuit packaging system 100, the integrated circuit packaging system 2100 includes internal connectors 2130 and an insulation layer 2132 having an insulation bottom side 2134 and an insulation top side 2136. In a manner similar to the integrated circuit packaging system 100, the integrated circuit packaging system 2100 includes external connectors 2138.

The integrated circuit packaging system 2100 can include vertical connectors 2140 with each of the vertical connectors 2140 having a connector top side 2142. The vertical connectors 2140 can be formed directly on the interior top side 2116. The encapsulation 2124 can be formed directly on the vertical connectors 2140. The connector top side 2142 can be exposed from the encapsulation 2124. The connector top side 2142 can be coplanar with the encapsulation top side 2128.

The integrated circuit packaging system 2100 can include a heat sink 2164, which is defined as a component or an assembly that conducts heat away from a semiconductor device. The heat sink 2164 can be mounted over the active side 2122. The heat sink 2164 can be attached to a portion of the interior bottom side 2114 closest to the integrated circuit 2118 with the portion electrically connected or attached to the active side 2122 with the internal connectors 2130.

An outer peripheral extent of the heat sink 2164 can be covered by the insulation layer 2132. A bottom extent of the heat sink 2164 can be exposed from the insulation layer 2132. The bottom extent of the heat sink 2164 can be coplanar with the insulation bottom side 2134. At least two non-horizontal sides of the heat sink 2164 can be horizontally surrounded by an array of the leads 2102.

It has been discovered that the internal connectors 2130 connected to the active side 2122 and the interior bottom side 2114 and the internal connectors 2130 horizontally surrounded by an array of the leads 2102 attached to at least two non-horizontal sides of the integrated circuit 2118 provides improved vertical height profile reduction for a semiconductor package since spacing between the leads 2102 is used for connecting the internal connectors 2130.

It has also been discovered that the encapsulation 2124 directly on the inactive side 2120 and the interior top side 2116 provides improved reliability since the encapsulation 2124 provides mechanical and environmental protection to the integrated circuit 2118 and the interior conductive layer 2112.

It has further been discovered that the insulation layer 2132 directly on the active side 2122 and a portion of the interior bottom side 2114 provides improved reliability since the insulation layer 2132 provides mechanical and environmental protection to the integrated circuit 2118 and the interior conductive layer 2112.

It has yet further been discovered that the encapsulation bottom side 2126 coplanar with the interior bottom side 2114 provides improved reliability since the encapsulation 2124 provides mechanical and environmental protection to the integrated circuit 2118 and the interior conductive layer 2112.

It has yet further been discovered that the active side 2122 facing the lead top side 2106 and the interior top side 2116 provides improved vertical height profile reduction with the internal connectors 2130 attached to the active side 2122 and the interior bottom side 2114 in the spacing completely horizontally surrounded by the leads 2102.

It has yet further been discovered that the heat sink 2164 attached to the interior bottom side 2114 provides improved reliability by conducting heat away from the integrated circuit 2118 through the internal connectors 2130 attached to the active side 2122 and the interior bottom side 2114 and by a bottom extent of the heat sink 2164 coplanar with the insulation bottom side 2134.

Figure 22:
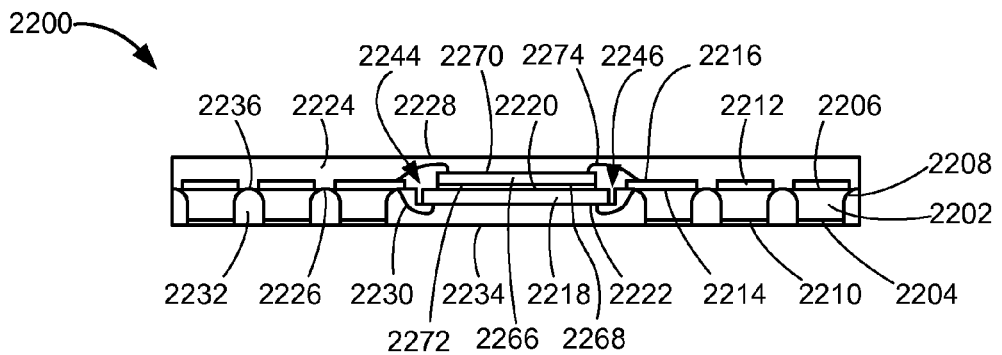
FIG. 22 is a cross-sectional view of an integrated circuit packaging system in a sixth embodiment of the present invention.

Referring now to FIG. 22, therein is shown a cross-sectional view of an integrated circuit packaging system 2200 in a sixth embodiment of the present invention. In a manner similar to the integrated circuit packaging system 100 of FIG. 1, the integrated circuit packaging system 2200 includes leads 2202, each having a lead bottom side 2204, a lead top side 2206, and a lead non-horizontal side 2208. In a manner similar to the integrated circuit packaging system 100, the integrated circuit packaging system 2200 includes an exterior conductive layer 2210 and an interior conductive layer 2212 having an interior bottom side 2214 and an interior top side 2216. In a manner similar to the integrated circuit packaging system 100, the integrated circuit packaging system 2200 includes an integrated circuit 2218 having an inactive side 2220 and an active side 2222.

In a manner similar to the integrated circuit packaging system 100, the integrated circuit packaging system 2200 includes an encapsulation 2224 having an encapsulation bottom side 2226 and an encapsulation top side 2228. In a manner similar to the integrated circuit packaging system 100, the integrated circuit packaging system 2200 includes internal connectors 2230 and an insulation layer 2232 having an insulation bottom side 2234 and an insulation top side 2236.

The insulation layer 2232 can include an insulation recess 2244 and an insulation recess portion 2246. The insulation recess 2244 is defined as an indentation at the insulation top side 2236. The insulation recess 2244 is vertically bounded by a top extent of the insulation recess portion 2246. The insulation recess portion 2246 is defined as a portion of the insulation layer 2232 that includes a top extent below the insulation top side 2236.

The active side 2222 can be directly on a top extent of the insulation recess portion 2246. A non-horizontal side of the integrated circuit 2218 can be completely horizontally surrounded by a non-horizontal side of the insulation layer 2232 that horizontally bounds the insulation recess 2244.

The integrated circuit packaging system 2200 can include an additional integrated circuit 2266, which is defined as a semiconductor device. The additional integrated circuit 2266 can include an additional inactive side 2268 and an additional active side 2270 opposite the additional inactive side 2268.

The additional integrated circuit 2266 can be mounted over the integrated circuit 2218 with an attach layer 2272, which is defined as a structure for mounting a semiconductor device to another semiconductor device. The attach layer 2272 can be attached to the additional inactive side 2268 and the inactive side 2220 of the integrated circuit 2218. The additional inactive side 2268 can face the inactive side 2220. The additional integrated circuit 2266 mounted over the integrated circuit 2218 can represent a two-die back-to-back stack structure.

The integrated circuit packaging system 100 can include additional internal connectors 2274, which are defined as electrically conductive connectors. The additional internal connectors 2274 can be connected or attached to the interior top side 2216 and the additional active side 2270. The additional internal connectors 2274 and the additional integrated circuit 2266 can be covered by the encapsulation 2224.

It has been discovered that the internal connectors 2230 connected to the active side 2222 and the interior bottom side 2214 and the internal connectors 2230 horizontally surrounded by an array of the leads 2202 attached to at least two non-horizontal sides of the integrated circuit 2218 provides improved vertical height profile reduction for a semiconductor package since spacing between the leads 2202 is used for connecting the internal connectors 2230.

It has also been discovered that the encapsulation 2224 directly on the inactive side 2220 and the interior top side 2216 provides improved reliability since the encapsulation 2224 provides mechanical and environmental protection to the integrated circuit 2218 and the interior conductive layer 2212.

It has further been discovered that the insulation layer 2232 directly on the active side 2222 and a portion of the interior bottom side 2214 provides improved reliability since the insulation layer 2232 provides mechanical and environmental protection to the integrated circuit 2218 and the interior conductive layer 2212.

It has yet further been discovered that the encapsulation bottom side 2226 coplanar with the interior bottom side 2214 provides improved reliability since the encapsulation 2224 provides mechanical and environmental protection to the integrated circuit 2218 and the interior conductive layer 2212.

It has yet further been discovered that the active side 2222 facing the lead top side 2206 and the interior top side 2216 provides improved vertical height profile reduction with the internal connectors 2230 attached to the active side 2222 and the interior bottom side 2214 in the spacing completely horizontally surrounded by the leads 2202.

It has yet further been discovered that the insulation layer 2232 having the insulation recess 2244 vertically bounded by the insulation recess portion 2246 provided improved vertical height profile reduction since the insulation recess portion 2246 allows a stack of the additional integrated circuit 2266 over the integrated circuit 2218 to mount thereon.

Figure 23:
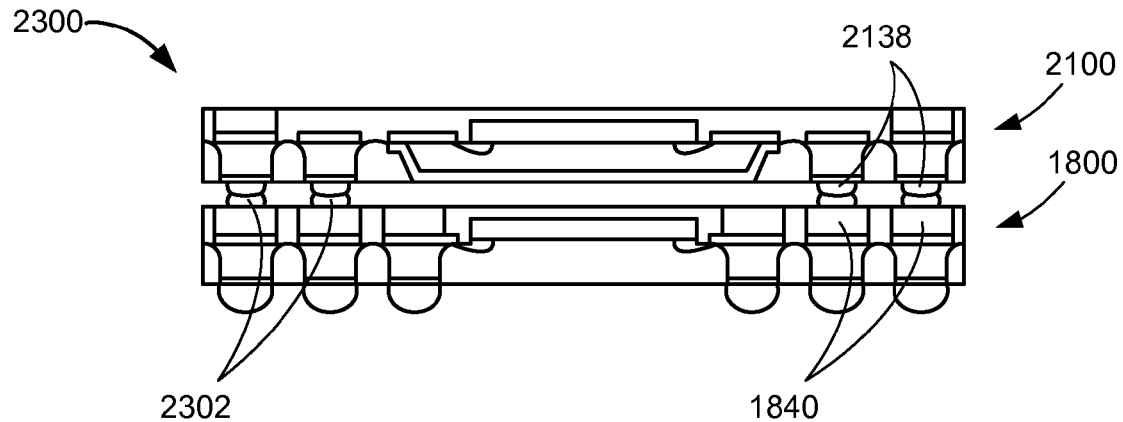
FIG. 23 is a cross-sectional view of an integrated circuit packaging system in a seventh embodiment of the present invention.

Referring now to FIG. 23, therein is shown a cross-sectional view of an integrated circuit packaging system 2300 in a seventh embodiment of the present invention. The integrated circuit packaging system 2300 can include a ball mount structure with the integrated circuit packaging system 2100 mounted over the integrated circuit packaging system 1800 with interconnects 2302, which are defined as electrically conductive connectors. For illustration purposes, the cross-sectional view depicts the integrated circuit packaging system 2100 mounted over the integrated circuit packaging system 1800, although it is understood that the integrated circuit packaging system 2300 can include any number and combination of embodiments of the present invention stacked or mounted over each other.

The interconnects 2302 can be attached to the vertical connectors 1840 of the integrated circuit packaging system 1800 and the external connectors 2138 of the integrated circuit packaging system 2100. The interconnects 2302 can represent electrical connectors including conductive balls or conductive paste. The interconnects 2302 can include a conductive material including solder, a metallic material, or a metal alloy. The interconnects 2302 can be formed with a connection formation method including printing or ball mounting.

It has been discovered that the integrated circuit packaging system 1800 provides improved reliability with a robust structure for mounting the integrated circuit packaging system 2100 thereon with the interconnects 2302 attached to the external connectors 2138 and the vertical connectors 1840.

Figure 24:
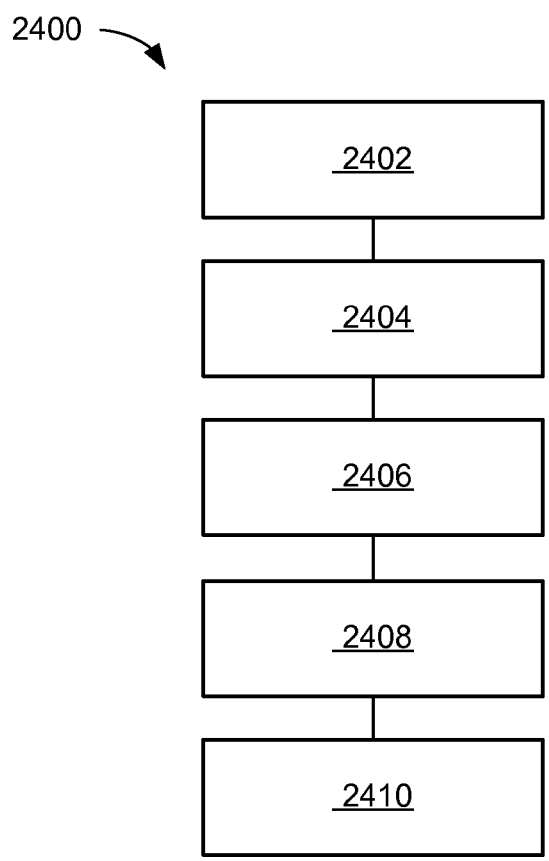
FIG. 24 is a flow chart of a method of manufacture of the integrated circuit packaging system in a further embodiment of the present invention.

Referring now to FIG. 24, therein is shown a flow chart of a method 2400 of manufacture of the integrated circuit packaging system 100 in a further embodiment of the present invention. The method 2400 includes: forming a lead in a block 2402; forming an interior conductive layer having an interior top side and an interior bottom side, the interior bottom side directly on the lead in a block 2404; mounting an integrated circuit over the lead, the integrated circuit having an inactive side and an active side in a block 2406; forming an encapsulation directly on the inactive side and the interior top side in a block 2408; and forming an insulation layer directly on the active side and a portion of the interior bottom side in a block 2410.

Thus, it has been discovered that the integrated circuit packaging system of the present invention furnishes important and heretofore unknown and unavailable solutions, capabilities, and functional aspects for an integrated circuit packaging system with leads. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a lead;
   forming an interior conductive layer having an interior top side and an interior bottom side, the interior bottom side directly on the lead;
   mounting an integrated circuit over the lead, the integrated circuit having an inactive side and an active side;
   forming an encapsulation directly on the inactive side and the interior top side; and
   forming an insulation layer directly on the active side and a portion of the interior bottom side.

2. The method as claimed in claim 1 wherein forming the encapsulation includes forming the encapsulation having an encapsulation bottom side coplanar with the interior bottom side.

3. The method as claimed in claim 1 further comprising connecting an internal connector to the integrated circuit and the interior conductive layer, the internal connector horizontally surrounded by the leads.

4. The method as claimed in claim 1 further comprising:
   forming a vertical connector directly on the interior top side, the vertical connector having a connector top side; and
   wherein:
   forming the encapsulation includes forming the encapsulation exposing the connector top side.

5. The method as claimed in claim 1 wherein forming the insulation layer includes forming the insulation layer having an insulation step portion with the active side directly thereon.

6. A method of manufacture of an integrated circuit packaging system comprising:
   forming a lead;
   forming an interior conductive layer having an interior top side and an interior bottom side, the interior bottom side directly on the lead;
   mounting an integrated circuit over the lead, the integrated circuit having an inactive side and an active side;
   forming an encapsulation directly on the inactive side and the interior top side; and
   forming an insulation layer directly on the lead, the active side, and a portion of the interior bottom side.

7. The method as claimed in claim 6 further comprising forming an additional interior conductive layer directly over the first interior conductive layer.

8. The method as claimed in claim 6 further comprising attaching a heat sink to the interior bottom side.

9. The method as claimed in claim 6 further comprising mounting an additional integrated circuit over the integrated circuit, the additional integrated circuit having an additional inactive side facing the inactive side.

10. The method as claimed in claim 6 further comprising:
    forming a vertical connector on the lead; and
    attaching an external connector to the vertical connector.

11. An integrated circuit packaging system comprising:
    a lead;
    an interior conductive layer having an interior top side and an interior bottom side, the interior bottom side directly on the lead;
    an integrated circuit over the lead, the integrated circuit having an inactive side and an active side;
    an encapsulation directly on the inactive side and the interior top side; and
    an insulation layer directly on the active side and a portion of the interior bottom side.

12. The system as claimed in claim 11 wherein the encapsulation includes an encapsulation bottom side coplanar with the interior bottom side.

13. The system as claimed in claim 11 further comprising an internal connector connected to the integrated circuit and the interior conductive layer, the internal connector horizontally surrounded by the leads.

14. The system as claimed in claim 11 further comprising:
    a vertical connector directly on the interior top side, the vertical connector having a connector top side; and
    wherein:
    the encapsulation exposes the connector top side.

15. The system as claimed in claim 11 wherein the insulation layer includes an insulation step portion with the active side directly thereon.

16. The system as claimed in claim 11 wherein the insulation layer is directly on the lead.

17. The system as claimed in claim 16 further comprising a second interior conductive layer directly over the first interior conductive layer.

18. The system as claimed in claim 16 further comprising a heat sink attached to the interior bottom side.

19. The system as claimed in claim 16 further comprising an additional integrated circuit over the integrated circuit, the additional integrated circuit having an additional inactive side facing the inactive side.

20. The system as claimed in claim 16 further comprising:
    a vertical connector on the lead; and
    an external connector attached to the vertical connector.

* * * * *